United States Patent [19]

Hayashi

[11] Patent Number: 5,643,857

[45] Date of Patent: Jul. 1, 1997

[54] METHOD OF MELTING CERAMIC SUPERCONDUCTIVE MATERIAL

[75] Inventor: Kazuhiko Hayashi, Osaka, Japan

[73] Assignee: Sumitomo Electric Industries, Ltd., Osaka, Japan

[21] Appl. No.: 700,059

[22] Filed: May 8, 1991

Related U.S. Application Data

[63] Continuation of Ser. No. 354,595, May 22, 1989, abandoned.

[30] Foreign Application Priority Data

Jun. 2, 1988 [JP] Japan ................... 63-136489

[51] Int. Cl.⁶ ..................................... C30B 11/02
[52] U.S. Cl. ................... 505/451; 505/729; 505/739; 505/782; 117/81; 117/223; 117/900; 420/505; 420/508
[58] Field of Search .................. 505/1, 729, 739, 505/782, 451; 156/600, 616.1, DIG. 83; 422/248, 241; 420/505, 508; 117/81, 223, 900

[56] References Cited

U.S. PATENT DOCUMENTS

| 1,228,194 | 5/1917 | Fahrenwald | 420/508 |
|---|---|---|---|
| 1,296,938 | 3/1919 | Fahrenwald | 420/508 |
| 1,339,505 | 5/1920 | Fahrenwald | 420/508 |
| 3,716,356 | 2/1973 | Burnett | 420/508 |
| 4,380,528 | 4/1983 | Shevakin et al. | 420/505 |
| 4,693,865 | 9/1987 | Goto | 427/572 |

FOREIGN PATENT DOCUMENTS

| 0082920 | 7/1983 | European Pat. Off. . |
|---|---|---|
| 0285168 | 10/1988 | European Pat. Off. . |
| 918119 | 7/1949 | Germany . |
| 2510684 | 9/1976 | Germany . |

OTHER PUBLICATIONS

McCallum et al., "Preparation of Single Crystals of Superconducting γβα–CuO From CuO," Appl. Phys. Lett. 51 (9) 31 Aug. 1987 pp. 690–691.

Liu et al, "Superconductivity and Structure of Single Crystal γβα$_2$Cu$_3$O$_x$," Physics Letters A, vol. 121, No. 6 May 4, 1987, pp. 305–306.

Verkautern, "Sem Analysis of Interactions Between Pf,Au and AgPd Capsules And β=γ–Cu Superconductors", Materials Letters, vol. 8, No. 1, 2, Apr. 1989, pp. 59–63.

McGuire et al., "Crystals", Applied Physics Letters vol. 51(13), 28 Sep. 1987 pp. 1040–1042.

Waszczak et al., "Critical Current Densities in Single Crystal Bi Sr CaCuO Applied Physics Letters" 52(20), 30 May 1988 pp. 1910–1912.

*Primary Examiner*—Robert Kunemund
*Attorney, Agent, or Firm*—Lowe, Price, LeBlanc & Becker

[57] ABSTRACT

A ceramic superconductive material (1) including a compound containing oxygen and at least two types of metal elements and having layer structure is molten in a vessel (2), at least an inner surface (3) of which is formed of a solid solution alloy having a base of gold or silver. Preferably the alloy is prepared from Au—5 to 40 wt. % Pd or Ag—5 to 40 wt. % Pd.

1 Claim, 1 Drawing Sheet

METHOD OF MELTING CERAMIC SUPERCONDUCTIVE MATERIAL

This application is a continuation of application Ser. No. 07/354,595 filed May 22, 1989 now abandoned.

BACKGROUND OF THE INVENTION

1. Field of the Invention

The present invention relates to a method of melting a ceramic superconductive material.

2. Description of the Background Art

In recent years, ceramic superconductive materials have been watched as materials having higher critical temperatures of superconductivity. In order to obtain a desired superconducting product with such a ceramic superconductive material, generally employed is a method of compacting the superconductive material and thereafter sintering the same, while another method of shaping a ceramic superconductive material by melting and solidifying the same is recently watched with interest.

However, it is empirically known that, in the method of melting a ceramic superconductive material for shaping the same into a wire rod or a thin film, the superconductive material may react with or be contaminated by the wall of a vessel such as a crucible employed for melting the superconductive material, and hence desired superconductor composition cannot be obtained or the superconductor is deteriorated in superconductivity.

SUMMARY OF THE INVENTION

Accordingly, the present invention has been proposed to solve the aforementioned problems, and an object thereof is to provide a method of melting a superconductive material which can attain desired composition with small deterioration in superconductivity.

The present invention is directed to a method of melting a ceramic superconductive material such as a superconductive material including a compound containing oxygen and at least two types of metal elements and having layer structure, for example. In order to solve the aforementioned technical problems, the superconductive material is molten in a vessel which is at least internally formed of a solid solution alloy having a base of gold or silver.

More preferably, the solid solution alloy having a base of gold or silver is prepared from Au—5 to 40 wt. % Pd or Ag—5 to 40 wt. % Pd.

The present invention has been proposed on the basis of such recognition that the aforementioned superconductive material can be effectively molten in a vessel which is at least internally formed of a solid solution alloy having a base of gold or silver with no reaction with or contamination from the wall of the vessel. The solid solution alloy causes no reaction with the superconductive material since all metals forming the alloy are so dissolved with each other that no metal is left independent.

Further, it is possible to adjust the melting point of the solid solution alloy at least internally forming the vessel by varying the content of an alloying element. Thus, various types of ceramic superconductive materials can be molten at different temperatures by adjusting the melting point of the solid solution alloy. For example, it is possible to melt superconductive materials having relatively high melting points such as those of Y—Ba—Cu—O and rare earth element—Ba—Cu—O systems as well as materials having relatively low melting points such as those of Bi—Sr—Ca—Cu—O, Bi—Pb—Sr—Ca—Cu—O and Tl—Ca—Ba—Cu—O systems. In particular, the present invention is suitable for melting the latter superconductive materials having relatively low melting points such as those of Bi—Sr—Ca—Cu—O, Bi—Pb—Sr—Ca—Cu—O and Tl—Ca—Ba—Cu—O systems.

The inventor has found that gold or silver causes no reaction with a ceramic superconductive material, and selected an element which can increase the melting point and strength against a high temperature with a relatively small content with respect to gold or silver, to provide an alloy for at least internally forming the vessel. To this end, palladium was noted as an element for forming a solid solution alloy with gold or silver. Palladium can be completely dissolved in gold or silver to increase the melting point by about 90° C. per atomic percentage. Although palladium itself reacts with a ceramic superconductive material, the degree of such reaction can be neglected if the content thereof is not more than 40 percent by weight. However, if the palladium content is less than 5 percent by weight, the melting point cannot be much increased and strength against a high temperature is rendered so insufficient that the vessel may be uselessly deformed in employment.

Thus, a prescribed amount of palladium is added to gold or silver to enable increase in strength against a high temperature as well as increase in melting point due to alloying within a range causing no reduction in an effect of suppressing reaction of gold or silver, whereby an alloy of Au—5 to 40 wt. % Pd or Ag—5 to 40 wt. % Pd can be advantageously employed as a material for at least internally forming a vessel for melting a superconductive material.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
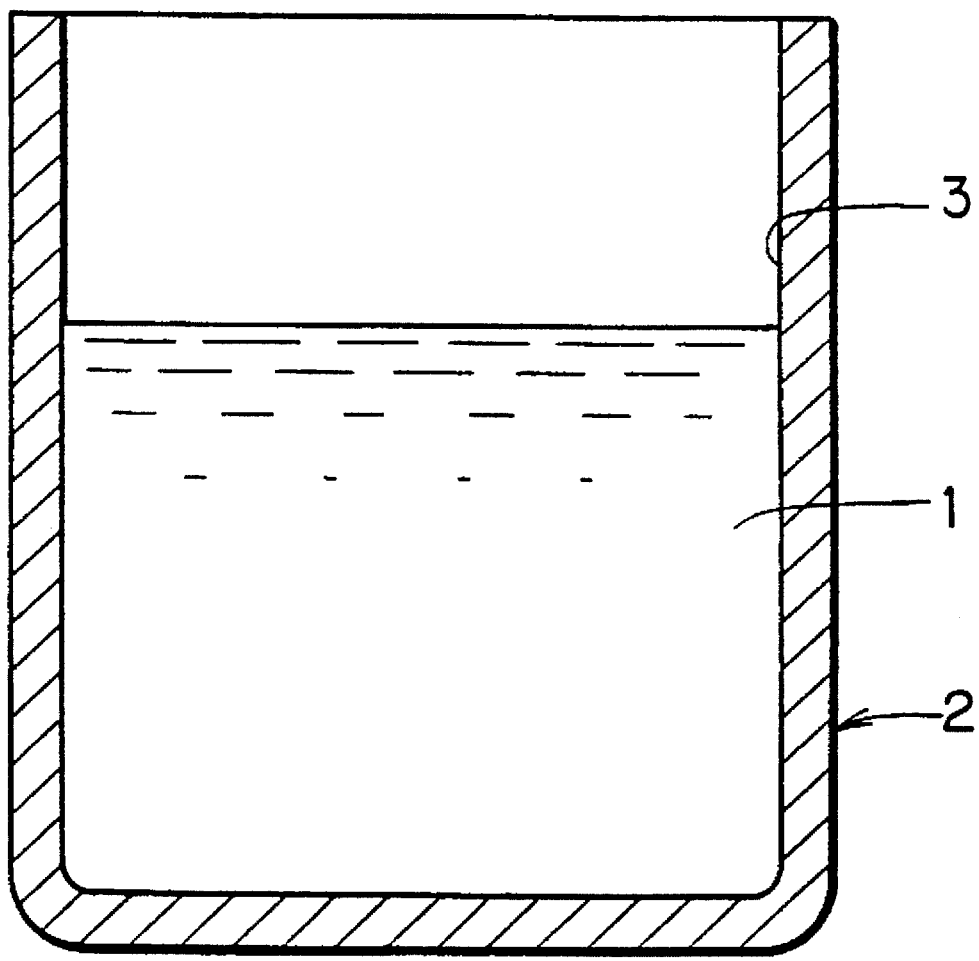
FIG. 1 is a sectional view showing a crucible employed in the present invention for melting a ceramic superconductive material.

Referring to FIG. 1, a ceramic superconductive material 1 is molten in a crucible 2. In order to melt the superconductive material 1, heat is applied to the crucible 2 by a heater means (not shown). The crucible 2 is formed of an alloy of Au—5 to 40 wt. % Pd or Ag—5 to 40 wt. % Pd as a whole, for example. Alternatively, only an inner surface 3 of the crucible 2, which is brought into contact with the superconductive material 1, may be formed of the aforementioned alloy.

In order to confirm an effect of the present invention, crucibles of 0.5 mm in thickness were prepared from materials listed in Table 1 to melt superconductive materials in the atmosphere at temperatures also shown in Table 1, thereby to obtain melts of Examples 1 to 8 and Reference Examples 1 to 3. The melts were cooled at the rate of 10° C./min. and solidified.

TABLE 1

|  |  | Crucible Material | Melt Composition | Melting Temperature | Melting State/Result |
|---|---|---|---|---|---|
| Example | 1 | Au-10 wt. % Pd | $Bi_6Sr_5Ca_5Cu_4O_x$ | 1100° C. | No Reaction/Crucible Not Deformed |
|  | 2 | Au-5 wt. % Pd | $Bi_2Sr_1Ca_1Cu_1O_x$ | 1000° C. | No Reaction/Crucible Not Deformed |
|  | 3 | Ag-40 wt. % Pd | $Tl_2Ca_2Ba_2Cu_3O_x$ | 1200° C. | No Reaction/Crucible Not Deformed |
|  | 4 | Au-40 wt. % Pd | $Bi_4Sr_3Ca_3Cu_4O_x$ | 1100° C. | No Reaction/Crucible Not Deformed |
|  | 5 | Ag-20 wt. % Pd | $Bi_1Sr_1Ca_1Cu_2O_x$ | 1100° C. | No Reaction/Crucible Not Deformed |
|  | 6 | Ag-30 wt. % Pd | $Tl_2Ca_1Ba_2Cu_2O_x$ | 1100° C. | No Reaction/Crucible Not Deformed |
|  | 7 | Au-35 wt. % Pd | $Y_{0.4}Ba_{0.6}Cu_1O_x$ | 1300° C. | No Reaction/Crucible Not Deformed |
|  | 8 | Au-10 wt. % Pd | $Bi_{1.4}Pb_{0.6}Sr_2Ca_2Cu_3O_x$ | 1050° C. | No Reaction/Crucible Not Deformed |
| Reference Example | 1 | Au-3 wt. % Pd | $Bi_2Sr_1Ca_1Cu_1O_x$ | 1000° C. | No Reaction/Crucible Deformed to Cause Break-Out |
|  | 2 | Ag-50 wt. % Pd | $Bi_1Sr_1Ca_1Cu_2O_x$ | 1100° C. | Strong Reaction/Crucible Not Deformed Crucible Partially Perforated to Cause Break-Out |
|  | 3 | Au-45 wt. % Pd | $Y_{0.4}Ba_{0.6}Cu_1O_x$ | 1350° C. | Strong Reaction/Crucible Not Deformed |

Table 1 also shows observation results of melting states in the crucibles and states of deformation of the crucibles in Examples 1 to 8 and Reference Examples 1 to 3 respectively.

As understood from Table 1, no reaction was caused between the melt and the crucible while the crucible was not deformed in each of Examples 1 to 8. In Reference Example 1, on the other hand, the crucible was deformed to cause break-out although no reaction was caused between the melt and the crucible. In Reference Example 2, strong reaction was caused between the melt and the crucible and the crucible was partially perforated to cause break-out, although the same was not deformed. In Reference Example 3, strong reaction was caused between the melt and the crucible although the crucible was not deformed.

Table 2 shows critical temperatures $T_C$ observed after holding the samples shown in Table 1 in the atmosphere at different temperatures for different periods and annealing the same at the rate of 2° C./min.

TABLE 2

|  |  | Annealing Condition | Tc |
|---|---|---|---|
| Example | 1 | 850° C. × 6 h., Annealed | 83K |
|  | 2 | 800° C. × 6 h., Annealed | 80K |
|  | 3 | 900° C. × 10 min., Annealed | 100K |
|  | 4 | 820° C. × 6 h., Annealed | 78K |
|  | 5 | 800° C. × 4 h., Annealed | 79K |
|  | 6 | 910° C. × 15 min., Annealed | 110K |
|  | 7 | 960° C. × 6 h., Annealed | 92K |
|  | 8 | 845° C. × 250 h., Annealed | 105K |
| Reference Example | 1 | Sampling Impossible | — |
|  | 2 | 800° C. × 4 h., Annealed | 55K |
|  | 3 | 900° C. × 6 h., Annealed | 70K |

As understood from Table 2, the critical temperature exceeded the liquid nitrogen temperature in each of Examples 1to 8. On the other hand, it was not possible to sample Reference Example 1, which caused break-out as hereinabove described. Further, it may be judged that Reference Examples 2and 3, which presented low critical temperatures, were deteriorated in superconductivity due to reaction with the crucibles, as compared with Examples 5 and 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of melting a Bi—Sr—Ca—Cu—O or Bi—Pb—Sr—Ca—Cu—O ceramic superconductive material, comprising preparing a vessel at least internally formed of a solid solution alloy consisting of a base of silver, and 5 to 40 wt % Pd, so as not to be reactive with or contaminate said Bi—Sr—Ca—Cu—O or Bi—Pb—Sr—Ca—Cu—O ceramic superconductive material and so as to increase the strength thereof to withstand temperatures higher than 1050° C.;

Introducing a Bi—Sr—Ca—Cu—O or Bi—Pb—Sr—Ca—Cu—O ceramic superconductive material into the vessel; and melting the superconductive material in the vessel at a temperature greater than 1050° C.

* * * * *